(12) United States Patent
Cheng et al.

(10) Patent No.: US 10,206,304 B2
(45) Date of Patent: Feb. 12, 2019

(54) LATCHING ASSEMBLY

(71) Applicant: EMC IP Holding Company, LLC, Hopkinton, MA (US)

(72) Inventors: Jesse Cheng, Shanghai (CN); Qingqiang Guo, Shanghai (CN); Jacky Jianguo Pang, Shanghai (CN); Weidong William Zou, Westborough, MA (US); Sean Xu Chen, Shanghai (CN); Aiqin Alice Liu, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/703,265

(22) Filed: Sep. 13, 2017

(65) Prior Publication Data

US 2018/0092237 A1    Mar. 29, 2018

(30) Foreign Application Priority Data

Sep. 23, 2016  (CN) .......................... 2016 1 0849638

(51) Int. Cl.
| | |
|---|---|
| *H05K 7/00* | (2006.01) |
| *H05K 5/00* | (2006.01) |
| *H05K 7/14* | (2006.01) |

(52) U.S. Cl.
CPC ......... *H05K 7/1489* (2013.01); *H05K 7/1401* (2013.01)

(58) Field of Classification Search
CPC ..................................................... G06F 1/16
USPC .................................................... 361/679.01
See application file for complete search history.

(56) References Cited

U.S. PATENT DOCUMENTS

| | | | |
|---|---|---|---|
| 2009/0279248 A1* | 11/2009 | Baker ..................... | G06F 1/187 361/679.58 |
| 2013/0078838 A1* | 3/2013 | Lin ......................... | G06F 1/187 439/345 |

* cited by examiner

*Primary Examiner* — Jerry Wu
(74) *Attorney, Agent, or Firm* — Brian J. Colandreo; Mark H. Whittenberger; Holland & Knight LLP (57) ABSTRACT

A latching assembly is configured for releasably coupling a first component to a second component. The latching assembly includes an actuator portion configured to be longitudinally-displaceable along an axis of insertion of the first component and between an engaged position and a disengaged position. One or more ejector assemblies include a first end and a second end. The one or more ejector assemblies are configured to: slidably engage the actuator portion on the first end, releasably engage a locking structure on the second end, and pivot about a rotation point positioned between the first end and the second end.

15 Claims, 6 Drawing Sheets

FIG. 1

FIG. 2A (front view)

LATCHING ASSEMBLY

RELATED CASES

The subject application claims the priority of China Patent Application No. 201610849638.1, filed on 23 Sep. 2016, the contents of which are herein incorporated by reference in its entirety.

TECHNICAL FIELD

This disclosure relates to IT components and, more particularly, to rack-mountable IT components.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various IT components are mounted within IT racks and need to be serviced in the field. Naturally, the quicker these IT components can be serviced, the less downtime for the IT component.

SUMMARY OF DISCLOSURE

In one implementation, a latching assembly is configured for releasably coupling a first component to a second component. The latching assembly includes an actuator portion configured to be longitudinally-displaceable along an axis of insertion of the first component and between an engaged position and a disengaged position. One or more ejector assemblies include a first end and a second end. The one or more ejector assemblies are configured to: slidably engage the actuator portion on the first end, releasably engage a locking structure on the second end, and pivot about a rotation point positioned between the first end and the second end.

One or more of the following features may be included. The second end of the one or more ejector assemblies may be configured to: releasably engage the locking structure when the actuator portion is displaced into the engaged position, and releasably disengage the locking structure when the actuator portion is displaced into the disengaged position. The first component may include a field replicable unit. The second component may include a portion of an IT component. The locking structure may include a pin structure on a chassis of the IT component. Releasably coupling the first component to the second component may include electrically coupling the first component to the second component. The actuator portion may be configured to be locked in the engaged position. The actuator portion may include at least a first slot configured to allow the actuator portion to be longitudinally-displaceable along the axis of insertion of the first component and between the engaged position and the disengaged position. The actuator portion may include at least a second slot configured to allow the first end of the one or more ejector assemblies to slidably engage the actuator portion. The one or more ejector assemblies may include a first ejector assembly and a second ejector assembly.

In another implementation, a latching assembly is configured for releasably coupling a first component to a second component. The latching assembly includes an actuator portion configured to be longitudinally-displaceable along an axis of insertion of the first component and between an engaged position and a disengaged position. One or more ejector assemblies include a first end and a second end, the one or more ejector assemblies configured to: slidably engage the actuator portion on the first end, releasably engage a locking structure on the second end, and pivot about a rotation point positioned between the first end and the second end. The first component includes a field replicable unit and the second component includes a portion of an IT component.

One or more of the following features may be included. The locking structure may include a pin structure on a chassis of the IT component. The actuator portion may include at least a first slot configured to allow the actuator portion to be longitudinally-displaceable along the axis of insertion of the first component and between the engaged position and the disengaged position. The actuator portion may include at least a second slot configured to allow the first end of the one or more ejector assemblies to slidably engage the actuator portion. The second end of the one or more ejector assemblies may be configured to: releasably engage the locking structure when the actuator portion is displaced into the engaged position, and releasably disengage the locking structure when the actuator portion is displaced into the disengaged position. Releasably coupling the first component to the second component may include electrically coupling the first component to the second component. The actuator portion may be configured to be locked in the engaged position.

In another implementation, a latching assembly is configured for releasably coupling a first component to a second component. The latching assembly includes an actuator portion configured to be longitudinally-displaceable along an axis of insertion of the first component and between an engaged position and a disengaged position. One or more ejector assemblies include a first end and a second end. The one or more ejector assemblies are configured to: slidably engage the actuator portion on the first end, releasably engage a locking structure on the second end when the actuator portion is displaced into the engaged position, releasably disengage the locking structure on the second end when the actuator portion is displaced into the disengaged position, and pivot about a rotation point positioned between the first end and the second end. The first component includes a field replicable unit and the second component includes a portion of an IT component.

One or more of the following features may be included. The locking structure may include a pin structure on a chassis of the IT component. The actuator portion may include at least a first slot configured to allow the actuator portion to be longitudinally-displaceable along the axis of insertion of the first component and between the engaged position and the disengaged position; and at least a second slot configured to allow the first end of the one or more ejector assemblies to slidably engage the actuator portion.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
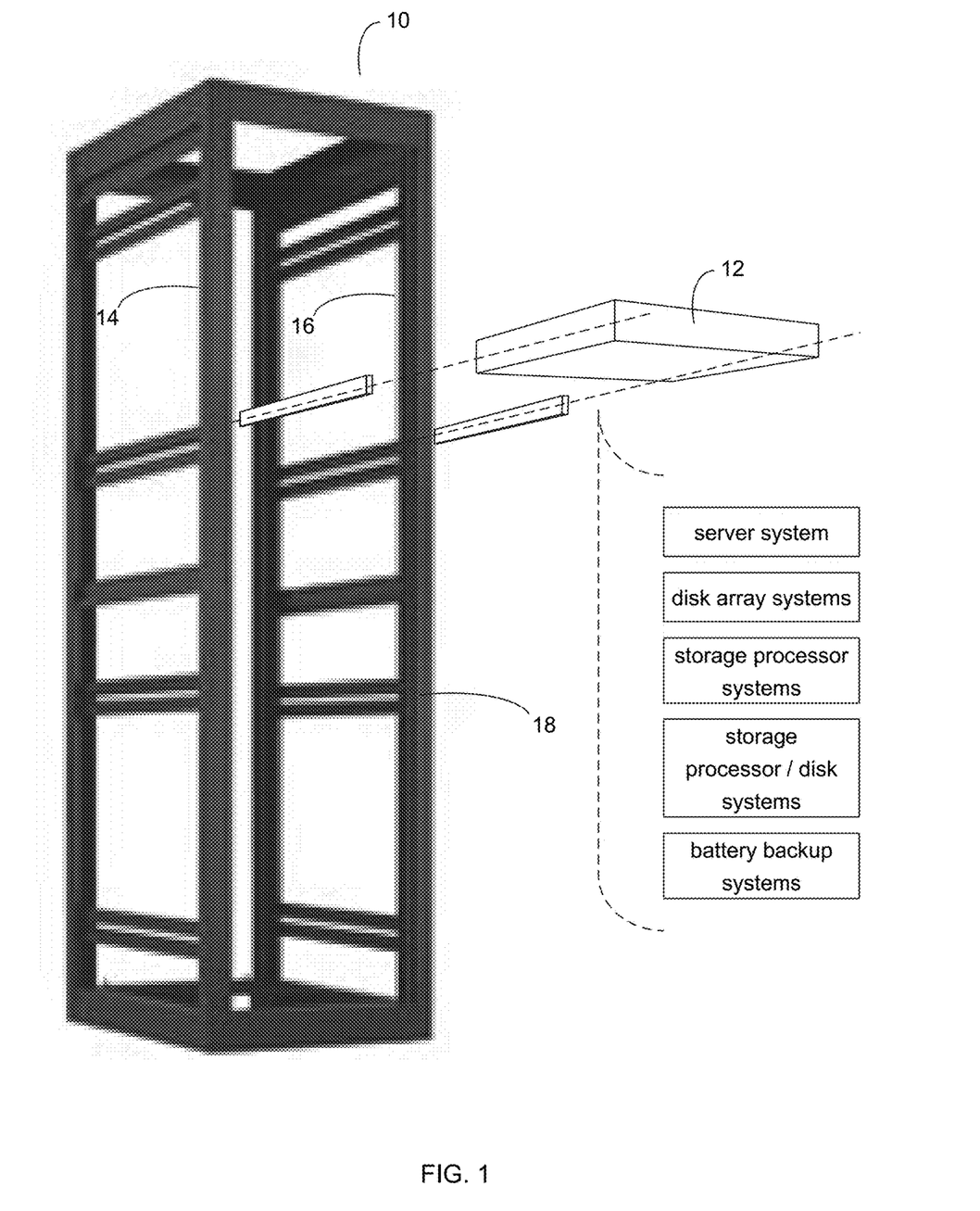
FIG. 1 is a perspective view of an IT rack and an IT component.

Referring to FIG. 1, IT racks (e.g., IT rack 10) may be utilized to store and organize IT components. For example, IT rack 10 may be placed within a computer room and various IT components (e.g., IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components that are configured to fit within IT rack 10 may be described as rack-mountable IT components.

Examples of the various IT components (e.g., IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components within IT rack 10. By standardizing the spacing between NEMA rails 14, 16, the various IT components that fit within a first IT rack may also fit within a second IT rack.

Typically, IT racks are defined in accordance with the number of rack units (U's) included within the rack. For example, a 1U IT component is half as high as a 2U IT component, which is half as high as a 4U IT component. Accordingly, while the number of rack units available within a particular IT rack may be rigidly defined by the size of the IT rack, the number of IT components mountable within that IT rack may vary depending upon the size (in rack units) of the particular IT components being mounted within that IT rack. Therefore, by reducing the number of rack units that a particular IT component uses within an IT rack, additional IT computing devices may be mounted within the IT rack.

Figure 2:
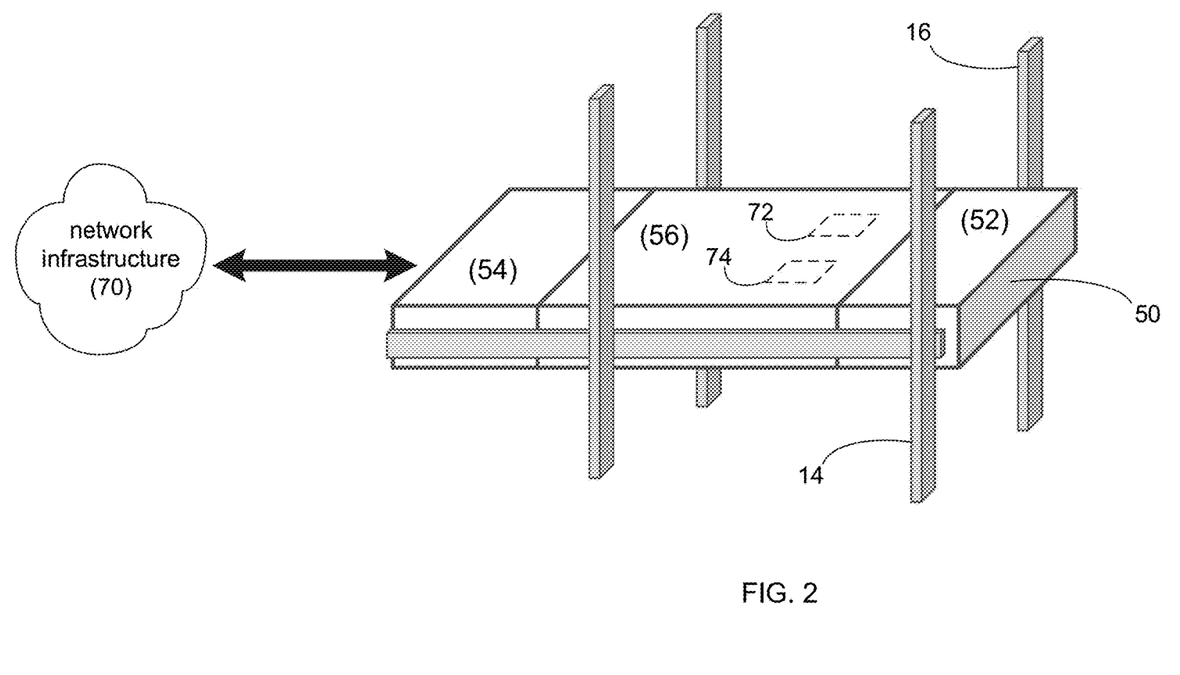
FIG. 2 is a diagrammatic view of a rack-mountable computing device for use within the IT rack of FIG. 1.

Referring to FIG. 2, there is shown one example of IT component 12, namely rack-mountable computing device 50. In this particular embodiment, rack-mountable computing device 50 is shown to include a plurality of individual components, examples of which may include but are not limited to storage component 52, input/output component 54, and processing component 56, any of which may be a field replaceable unit (FRU) that is serviceable in the field.

Figure 2A:
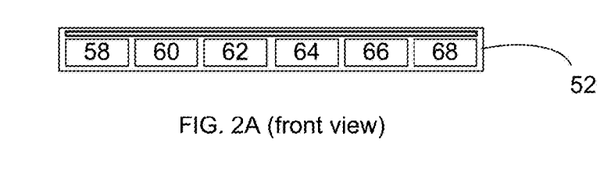
FIG. 2A is a front view of the rack-mountable computing device of FIG. 2.

Storage component 52 may be the portion of rack-mountable computing device 50 that is configured to store data. Examples of such data may include but are not limited to data that is generated remotely (e.g., by applications that are executed on remote devices) or data that is generated locally (e.g., by applications that are executed on rack-mountable computing device 50). Accordingly, storage component 52 may be configured to include one or more storage devices, examples of which may include but are not limited to one or more rotating-media hard disk drives (e.g., SATA drives or SCSI drives) and/or one or more solid state storage devices (e.g., flash drives). For example and as shown in FIG. 2A, storage component 52 may be configured to include six 2.5 inch form factor storage devices (e.g., storage devices 58, 60, 62, 64, 66, 68).

Input/output component 54 may be the portion of rack-mountable computing device 50 that is configured to couple rack-mountable computing device 50 to a network infrastructure (e.g., network infrastructure 70), wherein network infrastructure 70 may be configured to couple rack-mountable computing device 50 to other rack-mountable computing devices, other IT components (e.g., server systems, disk array systems, storage processor systems, storage processor/disk systems, and battery backup systems), other networking devices (e.g., switches, routers, bridges, wireless access points), and/or end user computing devices (e.g., desktop computers, laptop computers, notebook computers, smartphones, tablet computers, etc.). Examples of network infrastructure 70 may include but are not limited to an Ethernet infrastructure; a fiber channel infrastructure; and an infiniband infrastructure.

Processing component 56 may be the portion of rack-mountable computing device 50 that is configured to process data, such as data that is generated remotely (e.g., by applications that are executed on remote devices) or data that is generated locally (e.g., by applications that are executed on rack-mountable computing device 50). Accordingly, processing component 52 may be configured to include one or more microprocessors (e.g., microprocessors 72, 74).

Through the use of rack-mountable computing device 50, rack-mountable computing device 50 may be more easily serviced in the field by service technicians. Specifically, processing component 56 may be configured to be releasably coupleable to input/output component 54 and/or storage component 52.

Figure 3:
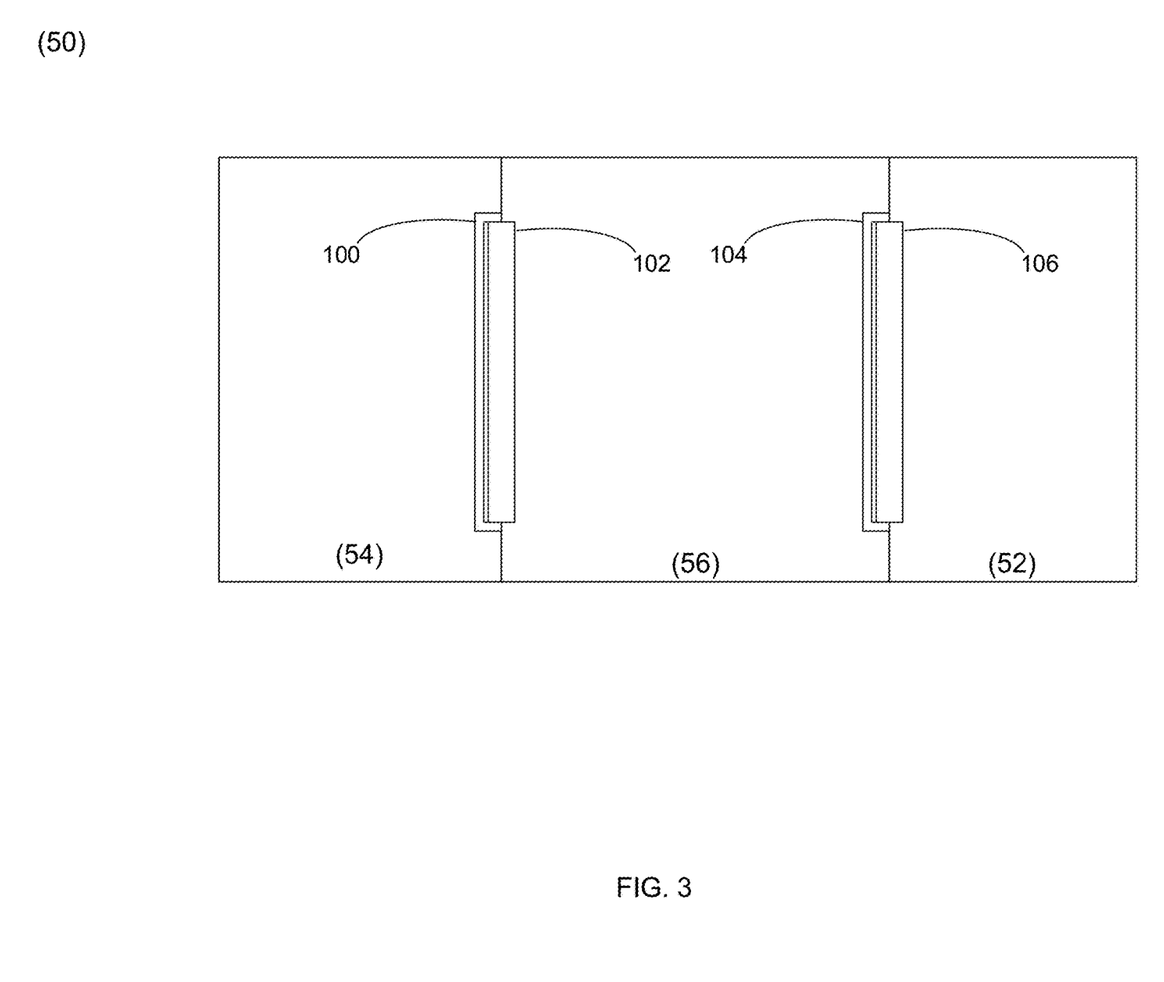
FIG. 3 is a diagrammatic view of the rack-mountable computing device of FIG. 2 including a coupling system.

For example and referring also to FIG. 3, each of processing component 56, input/output component 54, and storage component 52 may contain one or more electrical connector assemblies and alignment assemblies (e.g., alignment pins) to enable e.g., input/output component 54 to releasably couple (both electrically and mechanically) processing component 56, and to enable processing component 56 to releasably couple (both electrically and mechanically) storage component 52.

Specifically and in the following illustrative example, input/output component 54 may include electrical connector assembly 100 that is configured to releasably couple electrical connector assembly 102 included within processing component 56. Electrical connector assemblies 100, 102 may be configured and sized to accommodate the required number of electrical signals passing between input/output component 54 and processing component 56. Further, processing component 56 may include electrical connector assembly 104 that is configured to releasably couple electrical connector assembly 106 included within storage component 52. Electrical connector assemblies 104, 106 may be configured and sized to accommodate the required number of electrical signals passing between processing component 56 and storage component 52.

As will be discussed below in greater detail, rack-mountable computing device 50 may include a coupling system configured to releasably couple two or more of processing component 56, input/output component 54, and storage component 52 together.

Figure 4:
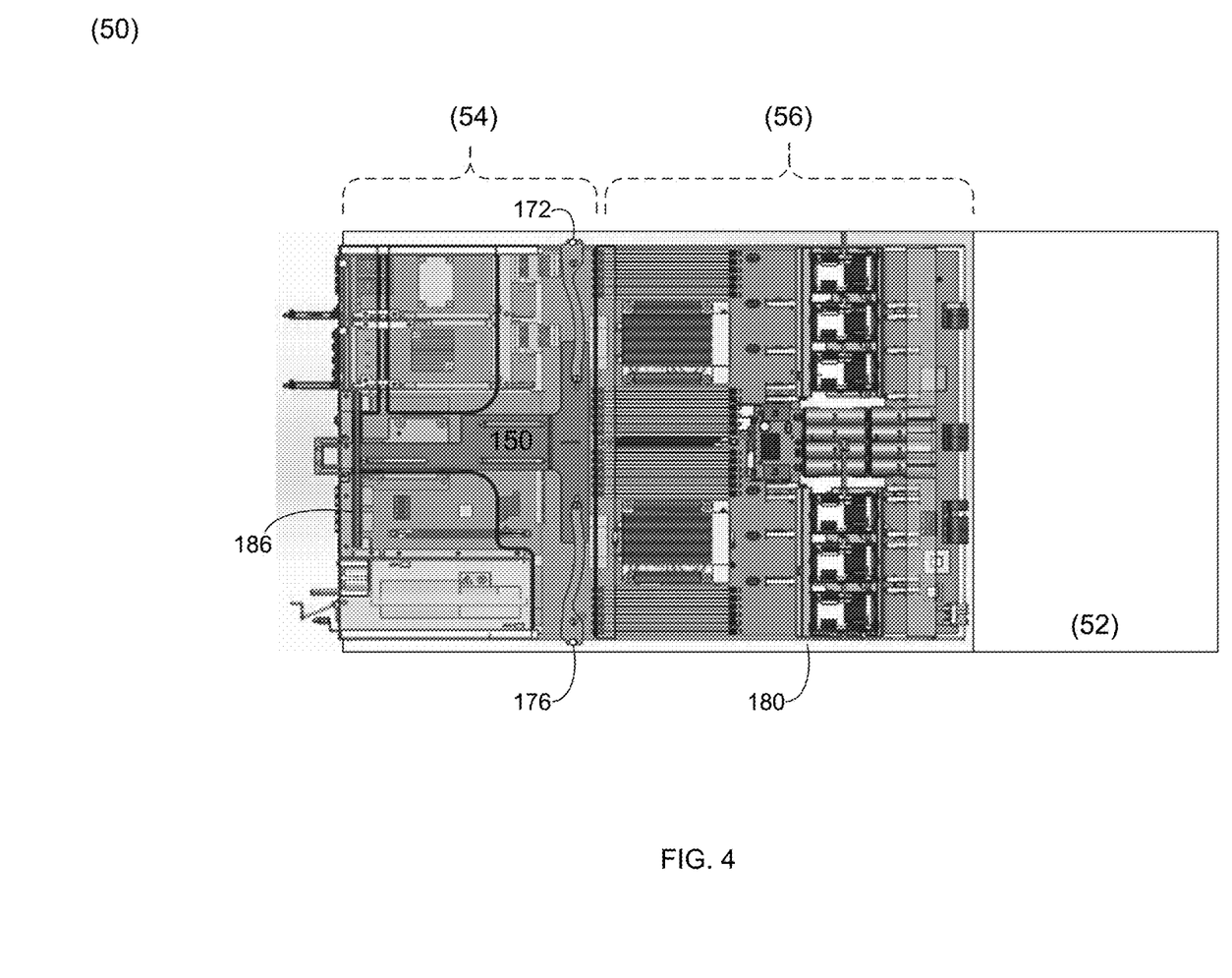
FIG. 4 is another diagrammatic view of the rack-mountable computing device of FIG. 2.

Referring also to FIG. 4, there is shown latching assembly 150 that may be configured to couple a first component of rack-mountable computing device 50 to a second component of rack-mountable computing device 50. For example, latching assembly 150 may be used to couple processing component 56 to input/output component 54 and/or couple storage component 52 to processing component 56. In this particular example, processing component 56 and input/output component 54 are shown as being a unified component, wherein latching assembly 150 is shown being configured to couple the combination of processing component 56 and input/output component 54 to storage component 52.

Figure 5:
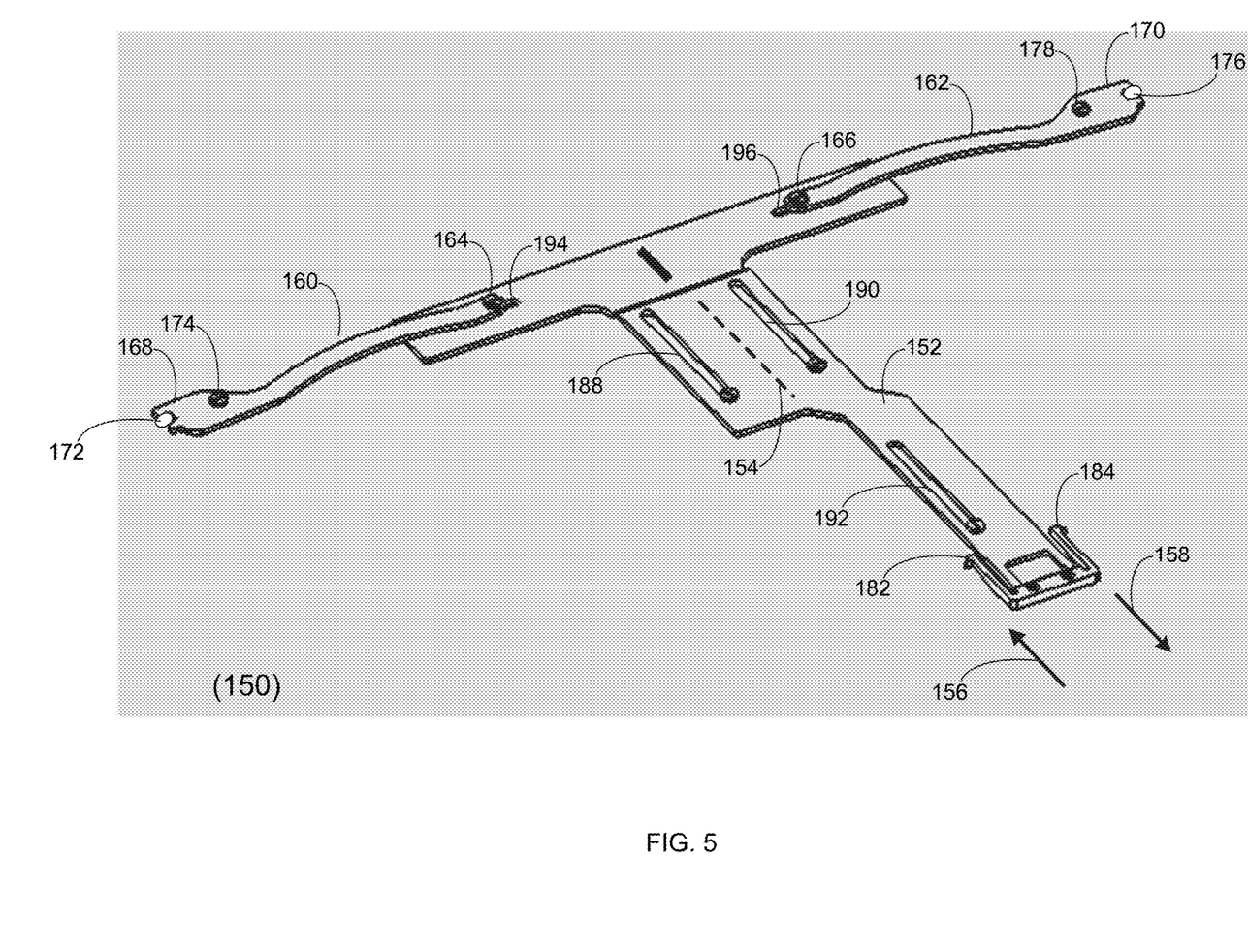
FIG. 5 is a diagrammatic view of a latching assembly for use with the rack-mountable computing device of FIG. 2.

Referring also to FIG. 5, latching assembly 150 may include actuator portion 152 configured to be longitudinally-displaceable along an axis of insertion (e.g., axis 154) of the first component (e.g., the combination of processing component 56 and input/output component 54) and between an engaged position and a disengaged position. In this particular example, the engaged position is when actuator portion 152 is moved in the direction of arrow 156, while the disengaged position is when actuator portion 152 is moved in the direction of arrow 158.

Latching assembly 150 may include one or more ejector assemblies (e.g., ejector assemblies 160, 162) including a first end (e.g., 164, 166 respectively) and a second end (e.g., 168, 170 respectively). Ejector assembly 160 may be configured to: slidably engage actuator portion 152 on first end 164, releasably engage a locking structure (e.g., pin structure 172) on second end 168, and pivot about a rotation point (e.g., rotation point 174) positioned between first end 164 and second end 168. Ejector assembly 162 may be configured to: slidably engage actuator portion 152 on first end 166, releasably engage a locking structure (e.g., pin structure 176) on second end 170, and pivot about a rotation point (e.g., rotation point 178) positioned between first end 166 and second end 170.

The above-discussed locking structures (e.g., pin structure 172 and pin structure 176) may be attached to a chassis (e.g., chassis 180, FIG. 4) of rack-mountable computing device 50, wherein once second ends 168, 170 of ejector assemblies 160, 162 (respectively) engage pin structures 172, 176 (respectively), the combination of processing component 56 and input/output component 54 may be releasably coupled to (in this example) storage component 52.

And when the combination of processing component 56 and input/output component 54 is releasably coupled to storage component 52, the combination of processing component 56 and input/output component 54 may also be electrically coupled to storage component 52 through the use of e.g., electrical connector assemblies 104, 106 (FIG. 3).

Actuator portion 152 of latching assembly 150 may be configured to be locked in the engaged position (i.e., the position shown by arrow 158). Accordingly, actuator portion 152 may include one of more latches (e.g., latches 182, 184) that may be configured to releasably engage a portion (e.g., portion 186, FIG. 4) of the combination of processing component 56 and input/output component 54, thus releasably locking actuator portion 152 in the engaged position (i.e., the position shown by arrow 158).

To allow actuator portion 152 to be displaced in the direction of arrows 156, 158, actuator portion 152 may include at least a first slot (e.g., slots 188, 190, 192) configured to allow actuator portion 152 to be longitudinally-displaceable along the axis of insertion (e.g., axis 154) of the first component (e.g., the combination of processing component 56 and input/output component 54) and between the engaged position (as illustrated by arrow 156) and the disengaged position (as illustrated by arrow 158). And to allow for the free movement of ejector assemblies 160, 162 with respect to actuator portion 152, actuator portion 152 may include at least a second slot (e.g., slots 194, 196) configured to allow the first end (e.g., first ends 164, 166) of ejector assemblies 160, 162 (respectively) to slidably engage actuator portion 152.

Figure 6A:
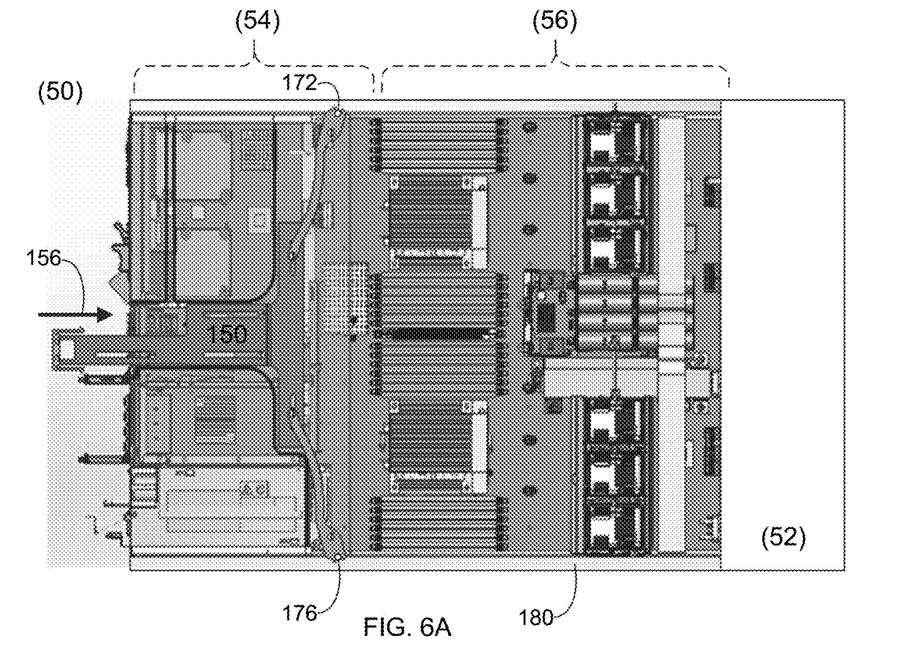
FIGS. 6A-6B are other diagrammatic views of the rack-mountable computing device of FIG. 2.
Figure 6B:
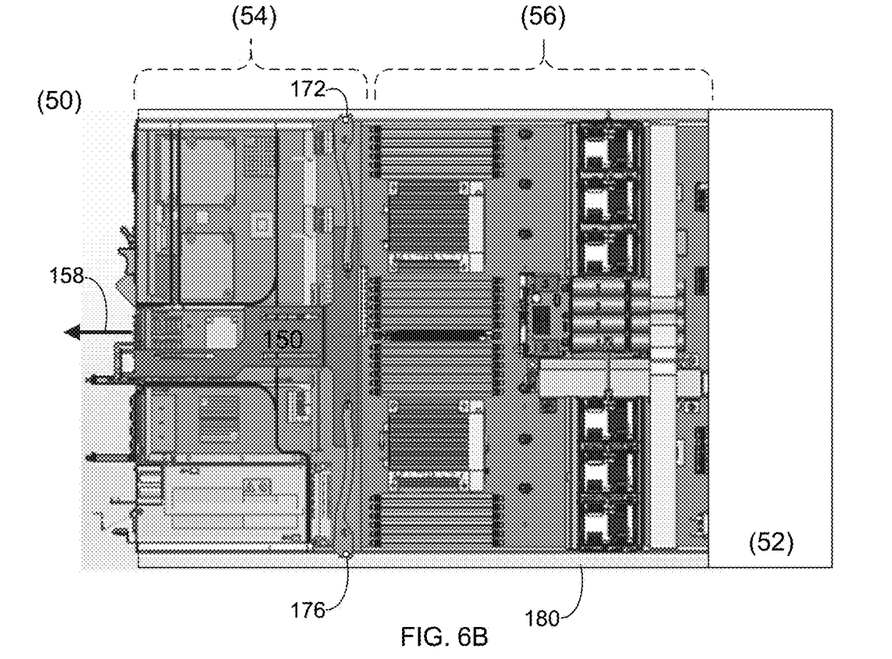

Referring also to FIGS. 6A and 6B, there is shown latching assembly 150 in a disengaged position (as shown in FIG. 6A) and in an engaged position (as shown in FIG. 6B).

Starting with latching assembly 150 in the disengaged position (as shown in FIG. 6A), assume that the combination of processing component 56 and input/output component 54 is being installed into rack-mountable computing device 50. Accordingly, the combination of processing component 56 and input/output component 54 may be slid into place (i.e., in the direction of arrow 156) until it makes contact with storage component 52. At this point, actuator portion 152 of latching assembly 150 may continue to be displaced in the direction of arrow 156, resulting in first ends 164, 166 of ejector assemblies 160, 162 (respectively) also moving in the direction of arrow 156. Additionally, second ends 168, 170 of ejector assemblies 160, 162 (respectively), which engage pin structures 172, 176 (respectively), may be displaced in a direction opposite to arrow 156 (due to ejector assemblies 160, 162 rotating about rotation points 174, 178 respectively), thus releasably engaging (in this example) the combination of processing component 56 and input/output component 54 with storage component 52.

Starting with latching assembly 150 in the engaged position (as shown in FIG. 6B), assume that the combination of processing component 56 and input/output component 54 is being removed from rack-mountable computing device 50. Accordingly, actuator portion 152 of latching assembly 150 may be unlocked from the engaged position (if necessary) and displaced in the direction of arrow 158, resulting in first ends 164, 166 of ejector assemblies 160, 162 (respectively) also moving in the direction of arrow 158. Additionally, second ends 168, 170 of ejector assemblies 160, 162 (respectively) may be displaced in a direction opposite to arrow 158 (due to ejector assemblies 160, 162 rotating about rotation points 174, 178 respectively), thus releasably disengaging (in this example) the combination of processing component 56 and input/output component 54 from storage component 52. Once releasably disengaged from storage component 52, the combination of processing component 56 and input/output component 54 may be slid in the direction of arrow 158 until removed.

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A latching assembly configured for releasably coupling a first component to a second component, the latching assembly comprising: an actuator portion configured to be longitudinally-displaceable along an axis of insertion of the first component and between an engaged position and a disengaged position, wherein the actuator portions includes: at least a first slot configured to allow the actuator portion to be longitudinally-displaceable along the axis of insertion of the first component and between the engaged position and the disengaged position, and one or more ejector assemblies including a first end and a second end, the one or more ejector assemblies configured to: slidably engage the actuator portion on the first end, releasably engage a locking structure on the second end, and pivot about a rotation point positioned between the first end and the second end; and at least a second slot perpendicular to the at least a first slot and configured to allow the first end of the one or more ejector assemblies to slidably engage the actuator portion.

2. The latching assembly of claim 1 wherein the second end of the one or more ejector assemblies is configured to:
releasably engage the locking structure when the actuator portion is displaced into the engaged position, and
releasably disengage the locking structure when the actuator portion is displaced into the disengaged position.

3. The latching assembly of claim 1 wherein the first component includes a field replicable unit.

4. The latching assembly of claim 1 wherein the second component includes a portion of an IT component.

5. The latching assembly of claim 4 wherein the locking structure includes a pin structure on a chassis of the IT component.

6. The latching assembly of claim 1 wherein releasably coupling the first component to the second component includes electrically coupling the first component to the second component.

7. The latching assembly of claim 1 wherein the actuator portion is configured to be locked in the engaged position.

8. The latching assembly of claim 1 wherein the one or more ejector assemblies includes a first ejector assembly and a second ejector assembly.

9. A latching assembly configured for releasably coupling a first component to a second component, the latching assembly comprising: an actuator portion configured to be longitudinally-displaceable along an axis of insertion of the first component and between an engaged position and a disengaged position, wherein the actuator portions includes: at least a first slot configured to allow the actuator portion to be longitudinally-displaceable along the axis of insertion of the first component and between the engaged position and the disengaged position, and one or more ejector assemblies including a first end and a second end, the one or more ejector assemblies configured to: slidably engage the actuator portion on the first end, releasably engage a locking structure on the second end, and pivot about a rotation point positioned between the first end and the second end; and at least a second slot perpendicular to the at least a first slot and configured to allow the first end of the one or more ejector assemblies to slidably engage the actuator portion; wherein the first component includes a field replicable unit and the second component includes a portion of an IT component.

10. The latching assembly of claim 9 wherein the locking structure includes a pin structure on a chassis of the IT component.

11. The latching assembly of claim 9 wherein the second end of the one or more ejector assemblies is configured to:
releasably engage the locking structure when the actuator portion is displaced into the engaged position, and
releasably disengage the locking structure when the actuator portion is displaced into the disengaged position.

12. The latching assembly of claim 9 wherein releasably coupling the first component to the second component includes electrically coupling the first component to the second component.

13. The latching assembly of claim 9 wherein the actuator portion is configured to be locked in the engaged position.

14. A latching assembly configured for releasably coupling a first component to a second component, the latching assembly comprising: an actuator portion configured to be longitudinally-displaceable along an axis of insertion of the first component and between an engaged position and a disengaged position, wherein the actuator portions includes: at least a first slot configured to allow the actuator portion to be longitudinally-displaceable along the axis of insertion of the first component and between the engaged position and the disengaged position, and one or more ejector assemblies including a first end and a second end, the one or more ejector assemblies configured to: slidably engage the actuator portion on the first end, releasably engage a locking structure on the second end when the actuator portion is displaced into the engaged position, releasably disengage the locking structure on the second end when the actuator portion is displaced into the disengaged position, and pivot about a rotation point positioned between the first end and the second end; and at least a second slot perpendicular to the at least a first slot and configured to allow the first end of the one or more ejector assemblies to slidably engage the actuator portion; wherein the first component includes a field replicable unit and the second component includes a portion of an IT component.

15. The latching assembly of claim 14 wherein the locking structure includes a pin structure on a chassis of the IT component.

* * * * *